US012770680B2

(12) United States Patent
Kuo et al.

(10) Patent No.: US 12,770,680 B2
(45) Date of Patent: Oct. 20, 2026

(54) SEMICONDUCTOR DEVICE AND OPERATING METHOD THEREOF

(71) Applicant: TAIWAN SEMICONDUCTOR MANUFACTURING COMPANY, LTD., Hsinchu (TW)

(72) Inventors: Yao-Jen Kuo, Hsinchu City (TW); Wei-Yu Lin, Taipei City (TW); Ming-Hung Chang, Tainan City (TW); Ching-Wei Wu, Nantou County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 84 days.

(21) Appl. No.: 18/756,142

(22) Filed: Jun. 27, 2024

(65) Prior Publication Data

US 2026/0004843 A1 Jan. 1, 2026

(51) Int. Cl.
*G11C 11/419* (2006.01)
*G11C 11/412* (2006.01)
*G11C 11/418* (2006.01)

(52) U.S. Cl.
CPC .......... *G11C 11/419* (2013.01); *G11C 11/412* (2013.01); *G11C 11/418* (2013.01)

(58) Field of Classification Search
CPC .................................................... G11C 11/419
See application file for complete search history.

(56) References Cited

U.S. PATENT DOCUMENTS

| | | | | | |
|---|---|---|---|---|---|
| 5,548,596 | A * | 8/1996 | Tobita | G11C 29/34 714/719 |
| 5,703,816 | A * | 12/1997 | Nam | G11C 29/78 365/201 |
| 5,946,251 | A * | 8/1999 | Sato | G11C 7/12 365/154 |
| 2006/0023555 | A1* | 2/2006 | Morishima | G11C 11/413 365/230.03 |
| 2007/0147160 | A1* | 6/2007 | Hanzawa | G11C 29/028 365/230.03 |
| 2008/0080279 | A1* | 4/2008 | Choi | G11C 7/12 365/203 |
| 2015/0357013 | A1* | 12/2015 | Park | G11C 7/12 365/203 |

* cited by examiner

*Primary Examiner* — Douglas King
(74) *Attorney, Agent, or Firm* — Birch, Stewart, Kolasch & Birch, LLP

(57) ABSTRACT

A semiconductor device includes a bit line pre-charger and a buffer circuit. The bit line pre-charger is configured to charge at least one bit line when a first control signal has a first voltage level. The buffer circuit is configured to generate the first control signal. During a first standby period, the buffer circuit adjusts the first control signal to a second voltage level different from the first voltage level.

20 Claims, 11 Drawing Sheets

100

SEMICONDUCTOR DEVICE AND OPERATING METHOD THEREOF

BACKGROUND

Self-timing static random access memory (SRAM) design uses critical path delay to form timing windows for various memory operations, such as operations associated with word lines, column selection and bit line pre-charge. However, these timing windows suffer from aging effect, such as bias temperature instability (BTI) effect, causing timing window degraded leading to incorrect functionality.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
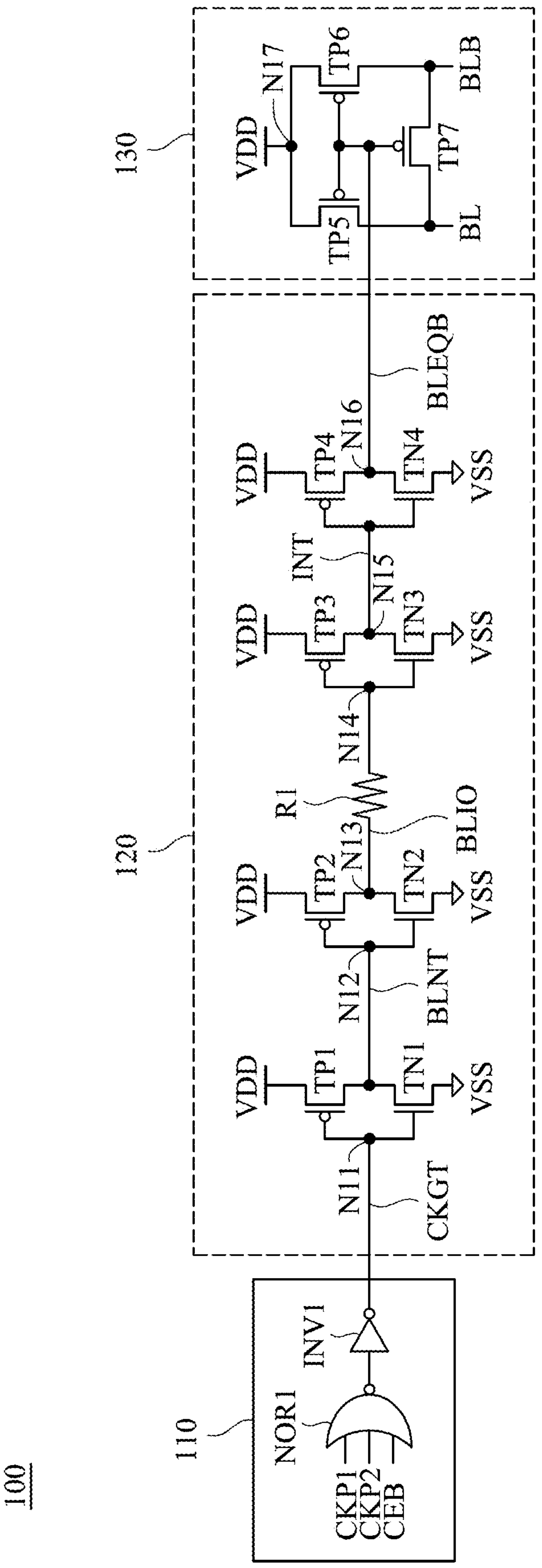
FIG. 1 is a schematic diagram of a semiconductor device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the down-scaling of the integrated circuits.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a semiconductor device 100 in accordance with some embodiments of the present disclosure. As illustratively shown in FIG. 1, the semiconductor device 100 includes a clock generator 110, a buffer circuit 120 and a bit line pre-charger 130. The clock generator 110 is configured to generate a control signal CKGT according to clock signals CKP1, CKP2 and an enable signal CEB. The buffer circuit 120 is configured to generate a control signal BLEQB according to the control signal CKGT. The bit line pre-charger 130 is configured to pre-charge bit lines BL and BLB according to the control signal BLEQB. In some embodiments, the buffer circuit 120 is referred to as a bit line pre-charge timing window generation critical path.

In some embodiments, the bit lines BL and BLB are coupled to multiple memory cells (not shown in figures) and are configured to perform read operations and write operations with the memory cells. In some embodiments, the memory cells are implemented by a static random-access memory (SRAM) array.

During the read operation and the write operation, a logic value carried by the bit line BL is complementary with a logic value carried by the bit line BLB. For example, when the bit line BL carries a logic value 0, the bit line BLB carries a logic value 1. When the bit line BL carries the logic value 1, the bit line BLB carries the logic value 0. In some embodiments, the bit line pre-charger 130 pre-charges the bit lines BL and BLB before the read operation and the write operation.

As illustratively shown in FIG. 1, the clock generator 110 includes logic elements NOR1 and INV1. Three input terminals of the logic element NOR1 are configured to receive the clock signals CKP1, CKP2 and the enable signal CEB, respectively. An output terminal of the logic element NOR1 is coupled to an input terminal of the logic element INV1. An output terminal of the logic element INV1 is configured to output the control signal CKGT at a node N11.

In some embodiments, the logic element NOR1 is implemented by a NOR logic gate, and the logic element INV1 is implemented by an inverter. Alternatively stated, the clock generator 110 is configured to perform an OR logic operation to the clock signals CKP1, CKP2 and the enable signal CEB to generate the control signal CKGT.

In some embodiments, the buffer circuit 120 corresponds to a bit line pre-charge timing window generation critical path. The buffer circuit 120 includes a resistor R1 and switches TP1-TP4, TN1-TN4.

As illustratively shown in FIG. 1, each of control terminals of the switches TP1 and TN1 are configured to receive the control signal CKGT at the node N11. A terminal of the switch TP1 is configured to receive a reference voltage signal VDD, and another terminal of the switch TP1 is coupled to a node N12. A terminal of the switch TN1 is configured to receive a reference voltage signal VSS, and another terminal of the switch TN1 is coupled to the node N12. In some embodiments, the switches TP1 and TN1 are configured to operate as an inverter which generates a control signal BLNT at the node N12 according to the control signal CKGT.

Similarly, each of control terminals of the switches TP2 and TN2 are configured to receive the control signal BLNT at the node N12. A terminal of the switch TP2 is configured to receive the reference voltage signal VDD, and another terminal of the switch TP2 is coupled to a node N13. A terminal of the switch TN2 is configured to receive a reference voltage signal VSS, and another terminal of the switch TN2 is coupled to the node N13. In some embodiments, the switches TP2 and TN2 are configured to operate as an inverter which generates a control signal BLIO at the node N13 according to the control signal BLNT.

As illustratively shown in FIG. 1, the resistor R1 is coupled between the node N13 and a node N14, and is configured to transmit the control signal BLIO to the node N14. Each of control terminals of the switches TP3 and TN3 are configured to receive the control signal BLIO at the node N14. A terminal of the switch TP3 is configured to receive the reference voltage signal VDD, and another terminal of the switch TP3 is coupled to a node N15. A terminal of the switch TN3 is configured to receive a reference voltage signal VSS, and another terminal of the switch TN3 is coupled to the node N15. In some embodiments, the switches TP3 and TN3 are configured to operate as an inverter which generates a control signal INT at the node N15 according to the control signal BLIO.

Similarly, each of control terminals of the switches TP4 and TN4 are configured to receive the control signal INT at the node N15. A terminal of the switch TP4 is configured to receive the reference voltage signal VDD, and another terminal of the switch TP4 is coupled to a node N16. A terminal of the switch TN4 is configured to receive a reference voltage signal VSS, and another terminal of the switch TN4 is coupled to the node N16. In some embodiments, the switches TP4 and TN4 are configured to operate as an inverter which generates the control signal BLEQB at the node N16 according to the control signal INT. The four inverters of the switches TP1-TP4 and TN1-TN4 are coupled in series between the node N11 and N16.

In some embodiments, the switches TP2 and TN2 correspond to a global buffer. The switches TP3, TP4, TN3 and TN4 correspond to a local buffer. The resistor R1 corresponds to a conductive line between the global buffer and the local buffer. In some embodiments, the switches TP1-TP4 are implemented by P-type metal-oxide-semiconductor (PMOS) transistors, and the switches TN1-TN4 are implemented by N-type metal-oxide-semiconductor (NMOS) transistors.

In some embodiments, the reference voltage signal VSS has a voltage level VL. The reference voltage signal VDD has a voltage level VH which is higher than the voltage level VL. The switches TP1-TP4 are turned on in response to the voltage level VL and are turned off in response to the voltage level VH. The switches TN1-TN4 are turned on in response to the voltage level VH and are turned off in response to the voltage level VL.

As illustratively shown in FIG. 1, the bit line pre-charger 130 includes switches TP5-TP7. Each of control terminals of the switches TP5-TP7 is configured to receive the control signal BLEQB at the node N16. A terminal of the switch TP5 is configured to receive the reference voltage signal VDD at a node N17, and another terminal of the switch TP5 is coupled to the bit line BL. A terminal of the switch TP6 is configured to receive the reference voltage signal VDD at the node N17, and another terminal of the switch TP6 is coupled to the bit line BLB. Two terminals of the switch TP7 is coupled to the bit lines BL and BLB, respectively. In some embodiments, the switches TP5-TP7 are implemented by PMOS transistors which are turned on in response to the voltage level VL and are turned off in response to the voltage level VH.

Alternatively stated, when the control signal BLEQB has the voltage level VL, the bit line pre-charger 130 is activated to charge the bit lines BL and BLB. When the control signal BLEQB has the voltage level VH or a floated voltage level, the bit line pre-charger 130 is deactivated to stop to charge the bit lines BL and BLB.

Figure 2A:
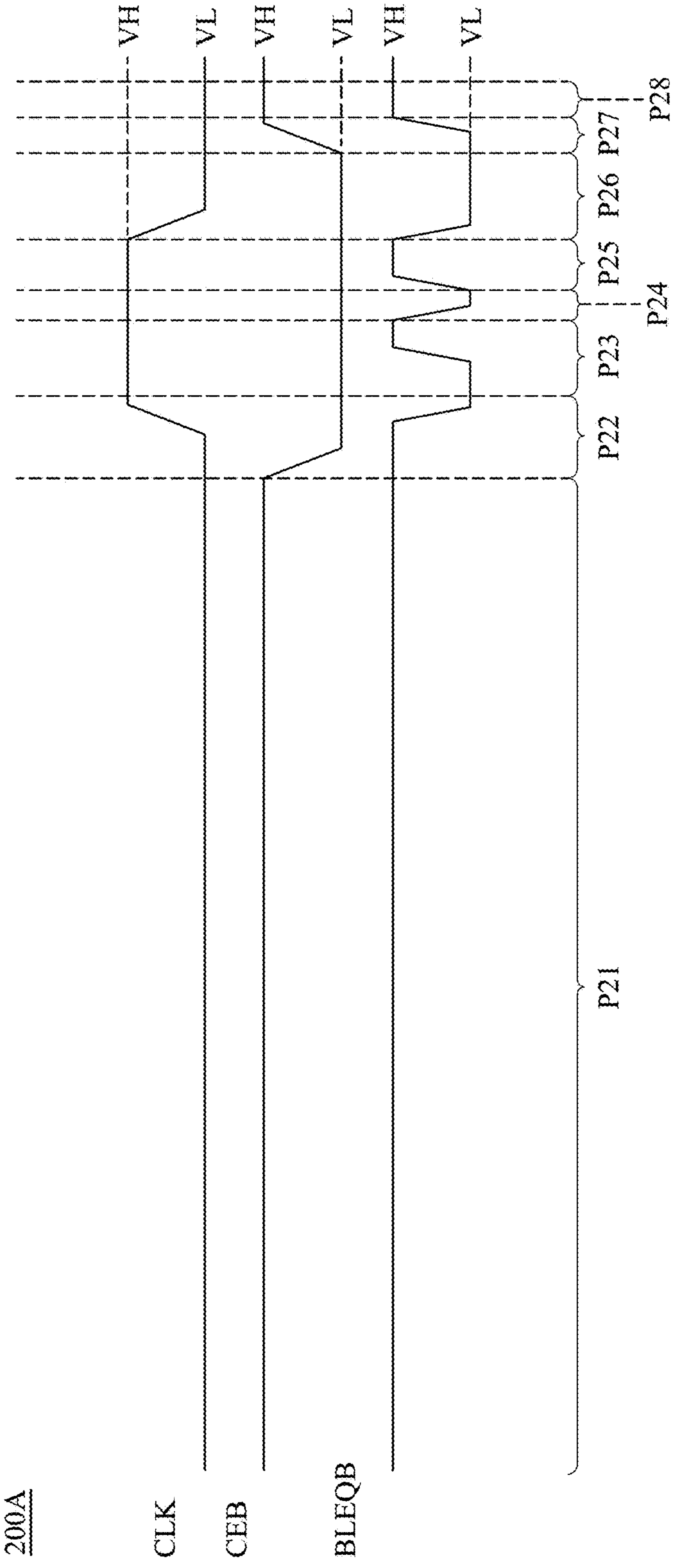
FIG. 2A is a timing diagram 200A corresponding to the semiconductor device 100 shown in FIG. 1, in accordance with some embodiments of the present disclosure.

FIG. 2A is a timing diagram 200A corresponding to the semiconductor device 100 shown in FIG. 1, in accordance with some embodiments of the present disclosure. As illustratively shown in FIG. 2A, the timing diagram 200A includes periods P21-P28 arranged in order. During periods P21-P28, a clock signal CLK, the enable signal CEB and the control signal BLEQB are configured to change between the voltage levels VH and VL. Referring to FIG. 1 and FIG. 2A, the memory cells corresponding to the bit lines are configured to operated according to the clock signal CLK. In some embodiments, the clock signal CLK is referred to as a system clock signal.

During the period P21, the clock signal CLK is maintained at the voltage level VL, and each of the enable signal CEB and the control signal BLEQB is maintained at the voltage level VH. Accordingly, the switches TN1, TP2, TN3 and TP4 are maintained to be turned on and are impacted by bias temperature instability (BTI) effect. The BTI effect is considered as an aging effect. The switches TP1, TN2, TP3 and TN4 are maintained to be turned off and are not impacted by BTI effect. In some embodiments, the period P21 is referred to as a standby period. Alternatively stated, the control signal BLEQB is kept at the high voltage level VH during the standby period. It is noted that the bit lines BL and BLB does not perform the read operation and the write operation during the standby period.

During the period P22, the enable signal CEB is changed from the voltage level VH to the voltage level VL, such that the control signal BLEQB is also changed from the voltage level VH to the voltage level VL. Accordingly, the switches TP1, TN2, TP3, TN4, TP5 and TP6 are turned on, such that the bit line pre-charger 130 provides the reference voltage signal VDD to each of the bit lines BL and BLB. Accordingly, each of the bit lines BL and BLB are pre-charged to the voltage level VH. The switches TN1, TP2, TN3 and TP4 are turned off. On the other hand, the clock signal CLK is changed from the voltage level VL to the voltage level VH.

During the period P23, the control signal BLEQB is changed from the voltage level VL to the voltage level VH to turn off the switches TP5 and TP6, such that the bit line pre-charger 130 stops to provide the reference voltage signal VDD to the bit lines BL and BLB. Accordingly, the memory cells perform the read operation with the bit lines BL and BLB.

During the period P24, the control signal BLEQB is changed from the voltage level VH to the voltage level VL to turn on the switches TP5 and TP6, such that the bit line pre-charger 130 provides the reference voltage signal VDD to each of the bit lines BL and BLB. Accordingly, each of the bit lines BL and BLB are pre-charged to the voltage level VH.

During the period P25, the control signal BLEQB is changed from the voltage level VL to the voltage level VH to turn off the switches TP5 and TP6, such that the bit line pre-charger 130 stops to provide the reference voltage signal VDD to the bit lines BL and BLB. Accordingly, the memory cells perform the write operation with the bit lines BL and BLB.

During the period P26, the control signal BLEQB is changed from the voltage level VH to the voltage level VL to turn on the switches TP5 and TP6, such that the bit line pre-charger 130 provides the reference voltage signal VDD to each of the bit lines BL and BLB. Accordingly, each of the bit lines BL and BLB are pre-charged to the voltage level VH. On the other hand, the clock signal CLK is changed from the voltage level VH to the voltage level VL.

During the period P27, the enable signal CEB is changed from the voltage level VL to the voltage level VH, such that the control signal BLEQB is also changed from the voltage level VL to the voltage level VH. Accordingly, the switches TP1, TN2, TP3, TN4, TP5 and TP6 are turned off, and the switches TN1, TP2, TN3 and TP4 are turned on.

During the period P28, the clock signal CLK is maintained at the voltage level VL, and each of the enable signal CEB and the control signal BLEQB is maintained at the voltage level VH. Accordingly, the switches TN1, TP2, TN3 and TP4 are maintained to be turned on and are impacted by bias temperature instability (BTI) effect. The switches TP1, TN2, TP3 and TN4 are maintained to be turned off and are not impacted by BTI effect. In some embodiments, the period P28 is referred to as a standby period.

Figure 2B:
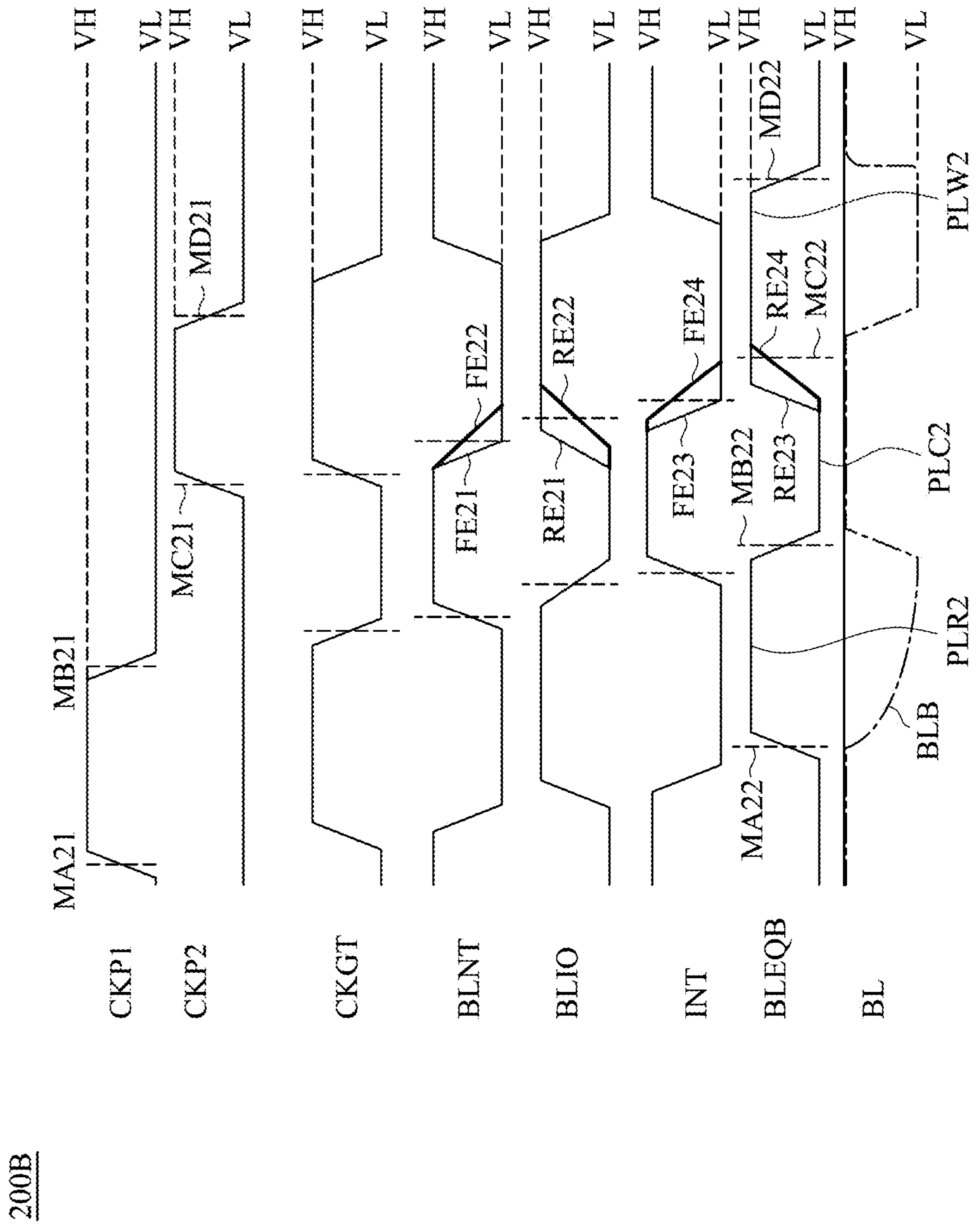
FIG. 2B is a timing diagram 200B corresponding to the semiconductor device 100 shown in FIG. 1, in accordance with some embodiments of the present disclosure.

FIG. 2B is a timing diagram 200B corresponding to the semiconductor device 100 shown in FIG. 1, in accordance with some embodiments of the present disclosure. As illustratively shown in FIG. 2B, the timing diagram 200B includes moments MA21, MA22, MB21, MB22, MC21, MC22, MD21 and MD22 arranged in order. The control signal BLEQB has pulses PLR2, PLC2 and PLW2.

Before the moment MA21, each of the clock signal CKP1 has the voltage level VL. The control signals CKGT, BLNT, BLIO, INT and BLEQB have the voltage levels VL, VH, VL, VH and VL, respectively. Accordingly, the switches TP5 and TP6 are turned on to charge each of the bit lines BL and BLB, such that each of the bit lines BL and BLB has the voltage level VH.

At the moment MA21, the clock signal CKP1 is raised from the voltage level VL to the voltage level VH. Accordingly, at the moment MA22, the control signal BLEQB is raised from the voltage level VL to the voltage level VH to form a rising edge of the pulse PLR2. Between the moments MA21 and MA22, the control signal CKGT is raised from the voltage level VL to the voltage level VH, the control signal BLNT is fallen from the voltage level VH to the voltage level VL, the control signal BLIO is raised from the voltage level VL to the voltage level VH, and the control signal INT is fallen from the voltage level VH to the voltage level VL.

After the moment MA22, in response to the control signal BLEQB having the voltage level VH, the switches TP5 and TP6 are turned off to stop to charge the bit lines BL and BLB, such that the bit lines BL and BLB perform the read operation. In the embodiment shown in FIG. 2B, the bit lines BL and BLB carry the logic value 1 and the logic value 0, respectively. Accordingly, the bit line BL is maintained at the voltage level VH, and the voltage level of the bit line BLB is decreased.

At the moment MB21, the clock signal CKP1 is fallen from the voltage level VH to the voltage level VL. Accordingly, at the moment MB22, the control signal BLEQB is fallen from the voltage level VH to the voltage level VL to form a falling edge of the pulses PLR2 and PLC2. Between the moments MB21 and MB22, the control signal CKGT is fallen from the voltage level VH to the voltage level VL, the control signal BLNT is raised from the voltage level VL to the voltage level VH, the control signal BLIO is fallen from the voltage level VH to the voltage level VL, and the control signal INT is raised from the voltage level VL to the voltage level VH.

After the moment MB22, in response to the control signal BLEQB having the voltage level VL, the switches TP5 and TP6 are turned on to charge each of the bit lines BL and BLB, such that each of the bit lines BL and BLB has the voltage level VH.

At the moment MC21, the clock signal CKP2 is raised from the voltage level VL to the voltage level VH. Accordingly, around the moment MC22, the control signal BLEQB is raised from the voltage level VL to the voltage level VH. Between the moments MC21 and MC22, the control signal CKGT is raised from the voltage level VL to the voltage level VH, the control signal BLNT is fallen from the voltage level VH to the voltage level VL, the control signal BLIO is raised from the voltage level VL to the voltage level VH, and the control signal INT is fallen from the voltage level VH to the voltage level VL.

As illustratively shown in FIG. 2B, the timing diagram 200B includes falling edges FE21-FE24 and rising edges RE21-RE24. Referring to FIG. 1 and FIG. 2B, before the buffer circuit 120 is affected by aging effect, the control signals BLNT, BLIO, INT and BLEQB have the falling edge FE21, the rising edge RE21, the falling edge FE23 and the rising edge RE23, respectively. After the buffer circuit 120 is affected by the aging effect, the control signals BLNT, BLIO, INT and BLEQB have the falling edge FE22, the rising edge RE22, the falling edge FE24 and the rising edge RE24, respectively.

In some embodiments, the aging effect decreased absolute value of slopes of the edges of the signals. Accordingly, an absolute value of a slope of the falling edge FE21 is larger than an absolute value of a slope of the falling edge FE22. An absolute value of a slope of the rising edge RE21 is larger than an absolute value of a slope of the rising edge RE22. An absolute value of a slope of the falling edge FE23 is larger than an absolute value of a slope of the falling edge FE24. An absolute value of a slope of the rising edge RE23 is larger than an absolute value of a slope of the rising edge RE24.

As illustratively shown in FIG. 2B, each of the rising edges RE23 and RE24 corresponds to the pulse PLC2. A distance between the rising edge RE23 and the moment MB22 is shorter than a distance between the rising edge RE24 and the moment MB22. Alternatively stated, the pulse PLC2 is wider after the aging effect. In some embodiments, a bit line pre-charge timing window is enhanced by the wider pulse PLC2.

Referring to FIG. 2B and FIG. 1, the switches TP1, TN2, TP3 and TN4 are turned on to generate a falling edge of the control signal BLEQB, and the switches TN1, TP2, TN3 and TP4 are turned on to generate a rising edge of the control signal BLEQB. Accordingly, in some embodiments, the switches TP1, TN2, TP3 and TN4 are referred to as falling edge devices, and the switches TN1, TP2, TN3 and TP4 are referred to as rising edge devices.

In some approaches, falling edge devices of a bit line pre-charge timing window generation critical path are impacted by BTI effect during a standby period. Accordingly, a pulse corresponding to pre-charge operation is narrower after the BTI effect. As a result, the bit lines cannot be well pre-charged.

Compared to above approaches, in some embodiments of present disclosure, the rising edge devices of the buffer circuit 120 are impacted by BTI effect during the standby periods P21 and P28. Accordingly, the pulse PLC2 is wider after the BTI effect. As a result, the bit lines BL and BLB can be well pre-charged between the moments MB22 and MC22.

After the moment MC22, in response to the control signal BLEQB having the voltage level VH, the switches TP5 and TP6 are turned off to stop to charge the bit lines BL and BLB, such that the bit lines BL and BLB perform the write operation. Accordingly, the bit line BL is maintained at the voltage level VH, and the voltage level of the bit line BLB is decreased.

At the moment MD21, the clock signal CKP2 is fallen from the voltage level VH to the voltage level VL. Accordingly, at the moment MD22, the control signal BLEQB is fallen from the voltage level VH to the voltage level VL to form a falling edge of the pulse PLW2. Between the moments MD21 and MD22, the control signal CKGT is fallen from the voltage level VH to the voltage level VL, the control signal BLNT is raised from the voltage level VL to the voltage level VH, the control signal BLIO is fallen from the voltage level VH to the voltage level VL, and the control signal INT is raised from the voltage level VL to the voltage level VH.

After the moment MD22, in response to the control signal BLEQB having the voltage level VL, the switches TP5 and TP6 are turned on to charge each of the bit lines BL and BLB, such that each of the bit lines BL and BLB has the voltage level VH.

Referring to FIG. 2B and FIG. 2A, the pulse PLR2 corresponds to the period P23 and the read operation. The pulse PLC2 corresponds to the period P24 and the pre-charge operation. The pulse PLW2 corresponds to the period P25 and the write operation. For example, the enable signal CEB is maintained at the voltage level VL between the moment MA22 and MD22.

Figure 3:
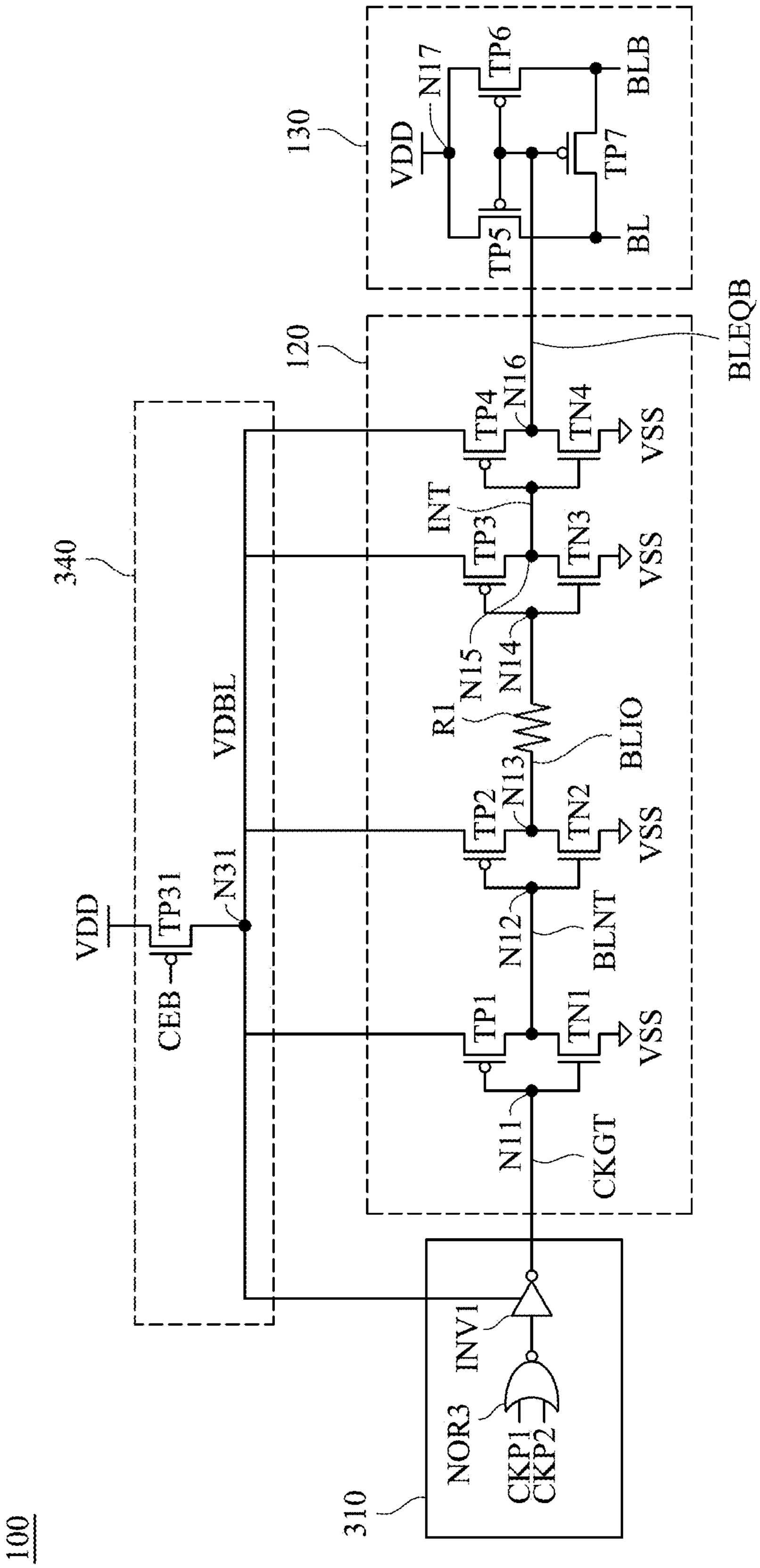
FIG. 3 is a schematic diagram of a semiconductor device 300 corresponding to the semiconductor device 100 shown in FIG. 1, in accordance with some embodiments of the present disclosure.

FIG. 3 is a schematic diagram of a semiconductor device 300 corresponding to the semiconductor device 100 shown in FIG. 1, in accordance with some embodiments of the present disclosure. Referring to FIG. 3 and FIG. 1, the semiconductor device 300 is an alternative embodiment of the semiconductor device 100. FIG. 3 follows a similar labeling convention to that of FIG. 1. For brevity, the discussion will focus more on differences between FIG. 3 and FIG. 1 than on similarities.

Compared to semiconductor device 100, the semiconductor device 300 further includes a power control circuit 340, and the semiconductor device 300 includes a clock generator 310 instead of the clock generator 110. In some embodiments, the power control circuit 340 is configured to generate a reference voltage signal VDBL according to the enable signal CEB. The buffer circuit 120 is configured to receive the reference voltage signal VDBL instead of the reference voltage signal VDD. The clock generator 310 is configured to generate the control signal CKGT according to the reference voltage signal VDBL and the clock signals CKP1 and CKP2.

As illustratively shown in FIG. 3, the clock generator 310 includes logic elements NOR3 and INV1. Two input terminals of the logic element NOR3 are configured to receive the clock signals CKP1 and CKP2, respectively. An output terminal of the logic element NOR3 is coupled to the input terminal of the logic element INV1. The output terminal of the logic element INV1 is configured to output the control signal CKGT at the node N11. A power terminal of the logic element INV1 is configured to receive the reference voltage signal VDBL. In some embodiments, the logic element NOR3 is implemented by a NOR logic gate.

In some embodiments, the power control circuit 340 includes a switch TP31. A terminal of the switch TP31 is configured of receive the reference voltage signal VDD, another terminal of the switch TP31 is configured to output the reference voltage signal VDBL at a node N31, and a control terminal of the switch TP31 is configured of receive the enable signal CEB. In the embodiment shown in FIG. 3, each of the switches TP1-TP4 are coupled to the node N31 to receive the reference voltage signal VDBL. In some embodiments, the switch TP31 is implemented by a PMOS transistor. It is noted that the node N31 corresponds to power terminals of the inverter INV1 and the inverters of the switches TP1-TP4 and TN1-TN4.

Figure 4A:
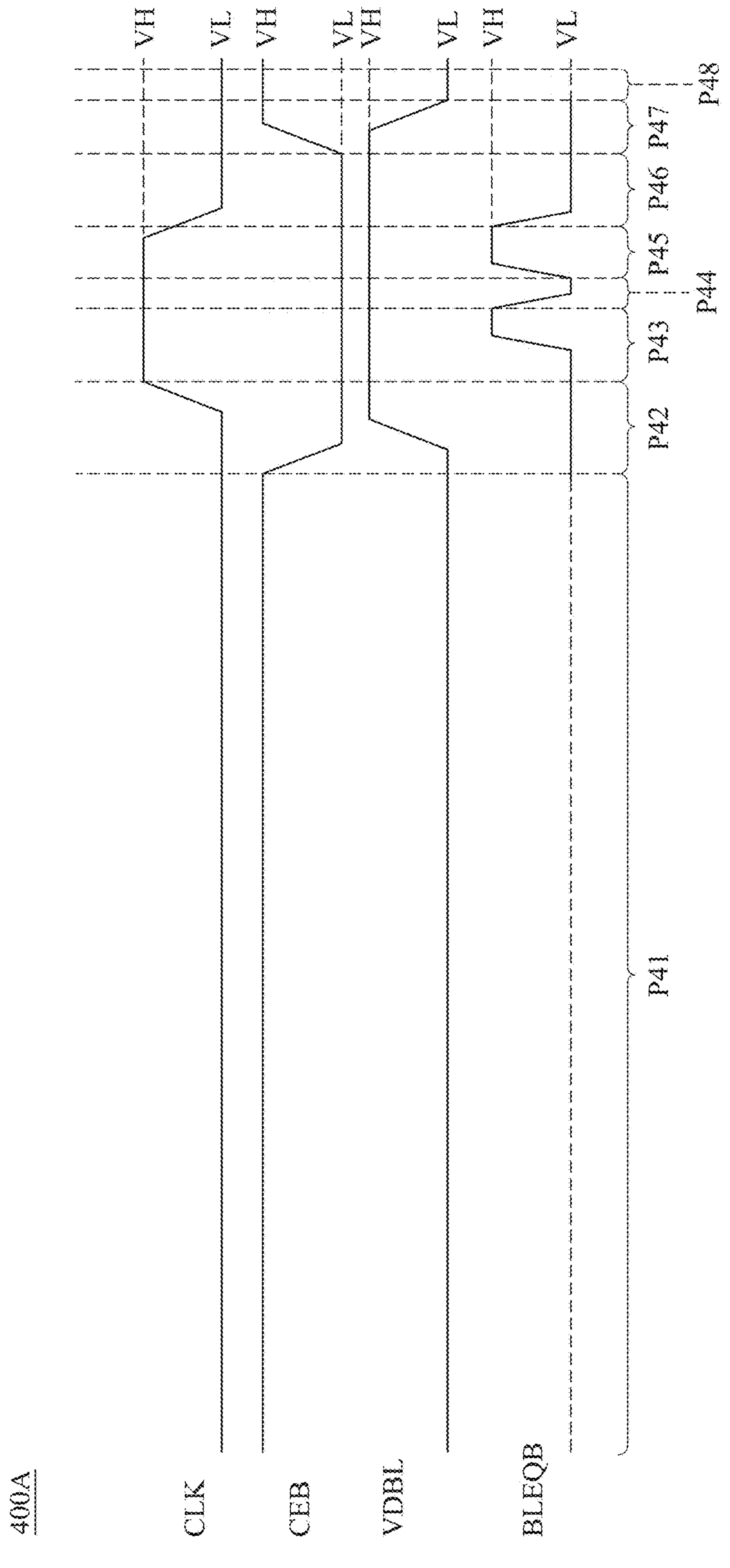
FIG. 4A is a timing diagram 400A corresponding to the semiconductor device 100 shown in FIG. 1, in accordance with some embodiments of the present disclosure.

FIG. 4A is a timing diagram 400A corresponding to the semiconductor device 100 shown in FIG. 1, in accordance with some embodiments of the present disclosure. As illustratively shown in FIG. 4A, the timing diagram 400A includes periods P41-P48 arranged in order. During periods P41-P48, the clock signal CLK, the reference voltage signal VDBL, the enable signal CEB and the control signal BLEQB are configured to change between the voltage levels VH and VL.

Referring to FIG. 4A and FIG. 2A, operations of the timing diagram 400A is an alternative embodiment of operations of the timing diagram 200A. The periods P41-P48 correspond to the periods P21-P28, respectively. For brevity, the discussion will focus more on differences between FIG. 4A and FIG. 2A than on similarities.

During the period P41, the enable signal CEB is maintained at the voltage level VH to turn off the switch TP31, such that the reference voltage signal VDBL has the voltage level VL. Accordingly, the inverter INV1 and the buffer circuit 120 are deactivated, such that nodes N11-N16 floated and the control signal BLEQB has a floated voltage level. It is noted that the switches TP5-TP7 are turned off when the control signal BLEQB has the floated voltage level.

During the period P42, the enable signal CEB is changed from the voltage level VH to the voltage level VL, to turn on the switch TP31, such that the reference voltage signal VDBL is changed from the voltage level VL to the voltage level VH. Accordingly, the inverter INV1 and the buffer circuit 120 are activated, such that the control signal BLEQB has the voltage level VL. The switches TP5 and TP6 are turned on to pre-charge the bit lines BL and BLB.

During the period P43, the control signal BLEQB is changed from the voltage level VL to the voltage level VH to turn off the switches TP5 and TP6, such that the bit line pre-charger 130 stops to pre-charge the bit lines BL and BLB. Accordingly, the memory cells perform the read operation with the bit lines BL and BLB.

During the period P44, the control signal BLEQB is changed from the voltage level VH to the voltage level VL to turn on the switches TP5 and TP6, such that the bit line pre-charger 130 provides the reference voltage signal VDD to each of the bit lines BL and BLB. Accordingly, each of the bit lines BL and BLB are pre-charged to the voltage level VH.

During the period P45, the control signal BLEQB is changed from the voltage level VL to the voltage level VH to turn off the switches TP5 and TP6, such that the bit line pre-charger 130 stops to pre-charge to the bit lines BL and BLB. Accordingly, the memory cells perform the write operation with the bit lines BL and BLB.

During the period P46, the control signal BLEQB is changed from the voltage level VH to the voltage level VL to turn on the switches TP5 and TP6, such that the bit line pre-charger 130 provides the reference voltage signal VDD to each of the bit lines BL and BLB. Accordingly, each of the bit lines BL and BLB are pre-charged to the voltage level VH.

During the period P47, the enable signal CEB is changed from the voltage level VL to the voltage level VH to turn off the switch TP31, such that the node N31 is discharged and the reference voltage signal VDBL is changed from the voltage level VH to the voltage level VL.

During the period P48, the reference voltage signal VDBL is maintained at the voltage level VL. Accordingly, the inverter INV1 and the buffer circuit 120 are deactivated, such that nodes N11-N16 floated and the control signal BLEQB has a floated voltage level.

In some approaches, falling edge devices of a bit line pre-charge timing window generation critical path receives a reference voltage signal having a high voltage level during a standby period. Accordingly, the bit line pre-charge timing window generation critical path is impacted by the BTI effect.

Compared to above approaches, in some embodiments of present disclosure, during the standby periods P41 and P48, the power control circuit 340 turns off the power supply for the bit line pre-charge timing window generation critical path. Accordingly, the nodes N11-N16 are floated, such that there is not bias voltage to induce the BTI effect. As a result, the full path becomes BTI free.

Figure 4B:
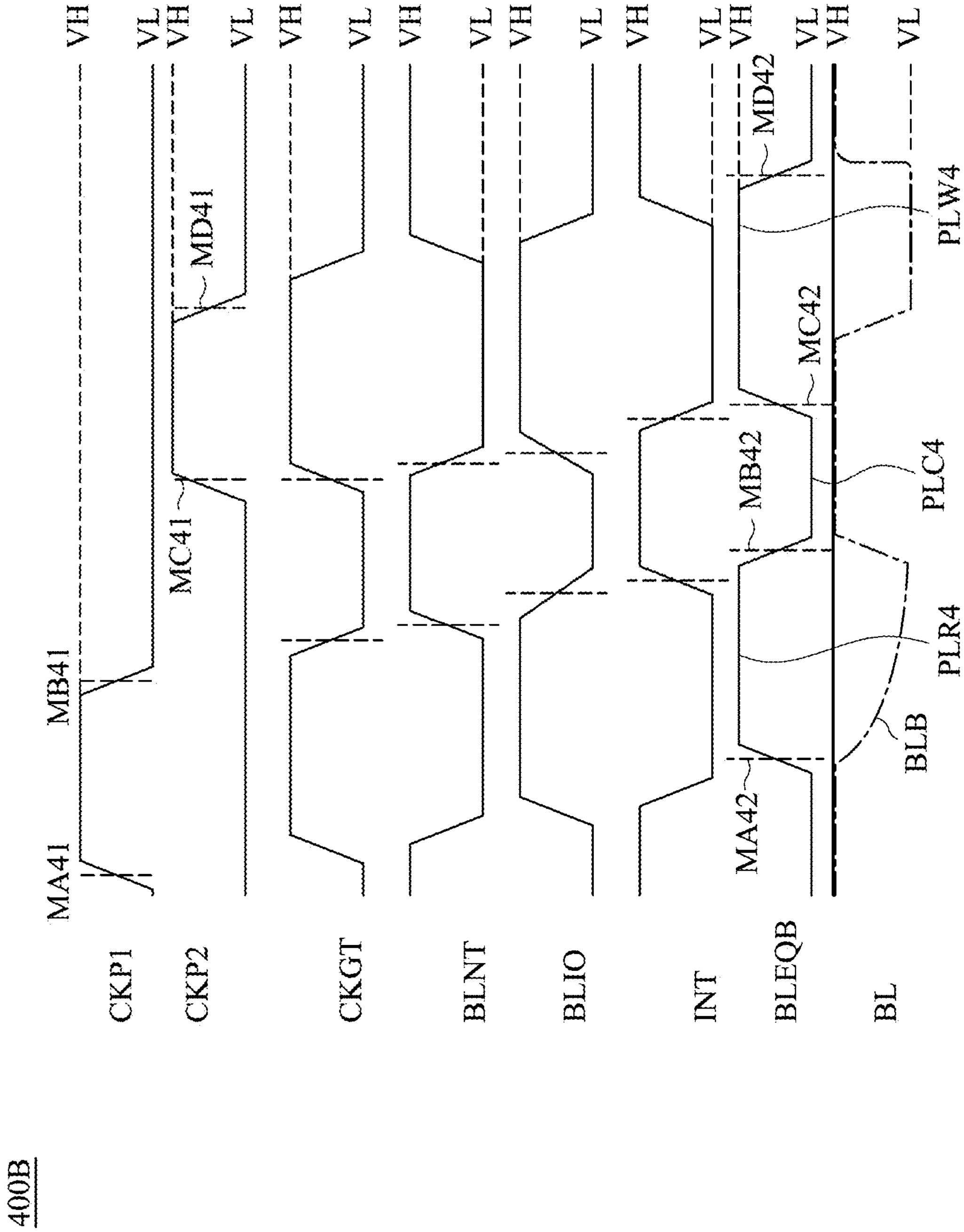
FIG. 4B is a timing diagram 400B corresponding to the semiconductor device 300 shown in FIG. 3, in accordance with some embodiments of the present disclosure.

FIG. 4B is a timing diagram 400B corresponding to the semiconductor device 300 shown in FIG. 3, in accordance with some embodiments of the present disclosure. As illustratively shown in FIG. 4B, the timing diagram 400B includes moments MA41, MA42, MB41, MB42, MC41, MC42, MD41 and MD42 arranged in order. The control signal BLEQB has pulses PLR4, PLC4 and PLW4.

Before the moment MA41, each of the clock signal has the voltage level VL. The control signals CKGT, BLNT, BLIO, INT and BLEQB have the voltage levels VL, VH, VL, VH and VL, respectively. Accordingly, the switches TP5 and TP6 are turned on to charge each of the bit lines BL and BLB, such that each of the bit lines BL and BLB has the voltage level VH.

At the moment MA41, the clock signal CKP1 is raised from the voltage level VL to the voltage level VH. Accordingly, at the moment MA42, the control signal BLEQB is raised from the voltage level VL to the voltage level VH to form a rising edge of the pulse PLR4. Between the moments MA41 and MA42, the control signal CKGT is raised from the voltage level VL to the voltage level VH, the control signal BLNT is fallen from the voltage level VH to the voltage level VL, the control signal BLIO is raised from the voltage level VL to the voltage level VH, and the control signal INT is fallen from the voltage level VH to the voltage level VL.

After the moment MA42, in response to the control signal BLEQB having the voltage level VH, the switches TP5 and TP6 are turned off to stop to charge the bit lines BL and BLB, such that the bit lines BL and BLB perform the read operation. In the embodiment shown in FIG. 4B, the bit lines BL and BLB carry the logic value 1 and the logic value 0, respectively. Accordingly, the bit line BL is maintained at the voltage level VH, and the voltage level of the bit line BLB is decreased.

At the moment MB41, the clock signal CKP1 is fallen from the voltage level VH to the voltage level VL. Accordingly, at the moment MB42, the control signal BLEQB is fallen from the voltage level VH to the voltage level VL to form a falling edge of the pulse PLR4. Between the moments MB41 and MB42, the control signal CKGT is fallen from the voltage level VH to the voltage level VL, the control signal BLNT is raised from the voltage level VL to the voltage level VH, the control signal BLIO is fallen from the voltage level VH to the voltage level VL, and the control signal INT is raised from the voltage level VL to the voltage level VH.

After the moment MB42, in response to the control signal BLEQB having the voltage level VL, the switches TP5 and TP6 are turned on to charge each of the bit lines BL and BLB, such that each of the bit lines BL and BLB has the voltage level VH.

At the moment MC41, the clock signal CKP2 is raised from the voltage level VL to the voltage level VH. Accordingly, at the moment MC42, the control signal BLEQB is raised from the voltage level VL to the voltage level VH. Between the moments MC41 and MC42, the control signal CKGT is raised from the voltage level VL to the voltage level VH, the control signal BLNT is fallen from the voltage level VH to the voltage level VL, the control signal BLIO is raised from the voltage level VL to the voltage level VH, and the control signal INT is fallen from the voltage level VH to the voltage level VL.

After the moment MC42, in response to the control signal BLEQB having the voltage level VH, the switches TP5 and TP6 are turned off to stop to charge the bit lines BL and BLB, such that the bit lines BL and BLB perform the write operation. Accordingly, the bit line BL is maintained at the voltage level VH, and the voltage level of the bit line BLB is decreased.

At the moment MD41, the clock signal CKP2 is fallen from the voltage level VH to the voltage level VL. Accordingly, at the moment MD42, the control signal BLEQB is fallen from the voltage level VH to the voltage level VL to form a falling edge of the pulse PLW4. Between the moments MD41 and MD42, the control signal CKGT is fallen from the voltage level VH to the voltage level VL, the control signal BLNT is raised from the voltage level VL to the voltage level VH, the control signal BLIO is fallen from the voltage level VH to the voltage level VL, and the control signal INT is raised from the voltage level VL to the voltage level VH.

After the moment MD42, in response to the control signal BLEQB having the voltage level VL, the switches TP5 and TP6 are turned on to charge each of the bit lines BL and BLB, such that each of the bit lines BL and BLB has the voltage level VH.

Referring to FIG. 4B and FIG. 4A, the pulse PLR4 corresponds to the period P43 and the read operation. The pulse PLC4 corresponds to the period P44 and the pre-charge operation. The pulse PLW4 corresponds to the period P45 and the write operation. For example, the enable signal CEB is maintained at the voltage level VL between the moment MA42 and MD42, and the reference voltage signal VDBL is maintained at the voltage level VH between the moment MA42 and MD42.

Figure 5:
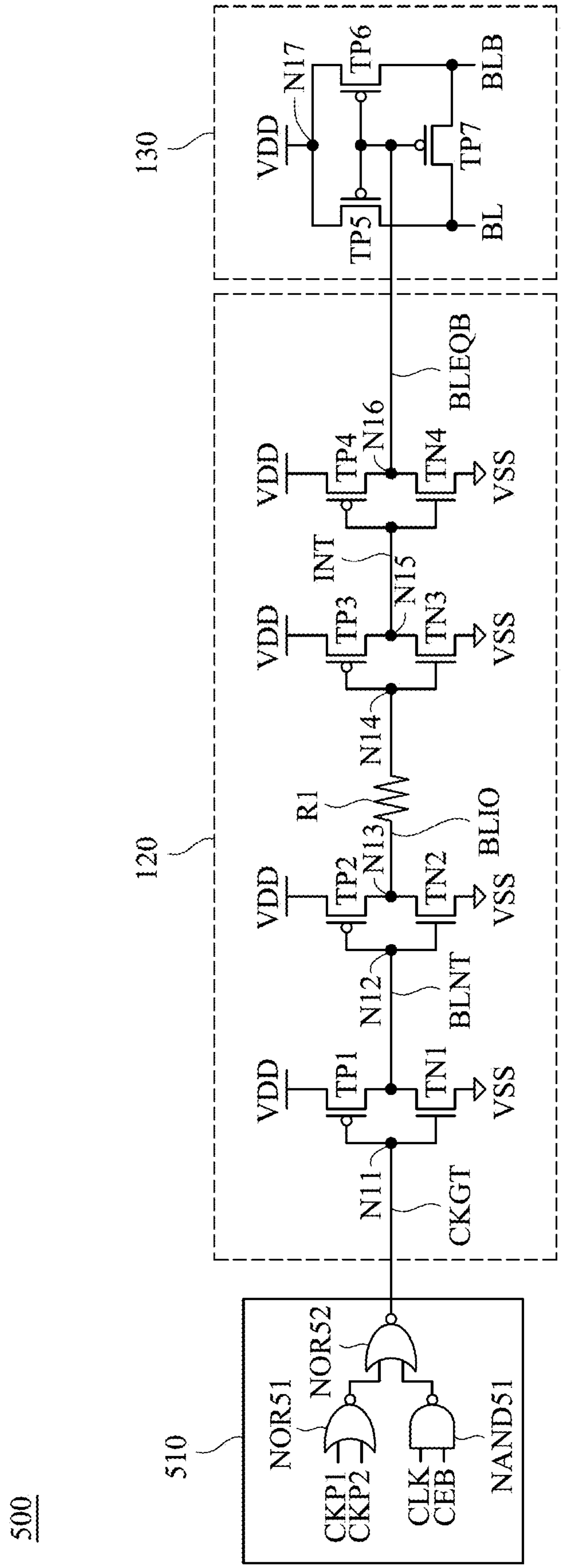
FIG. 5 is a schematic diagram of a semiconductor device 500 corresponding to the semiconductor device 100 shown in FIG. 1, in accordance with some embodiments of the present disclosure.

FIG. 5 is a schematic diagram of a semiconductor device 500 corresponding to the semiconductor device 100 shown in FIG. 1, in accordance with some embodiments of the present disclosure. Referring to FIG. 5 and FIG. 1, the semiconductor device 500 is an alternative embodiment of the semiconductor device 100. FIG. 5 follows a similar labeling convention to that of FIG. 1. For brevity, the discussion will focus more on differences between FIG. 5 and FIG. 1 than on similarities. Compared to semiconductor device 100, the semiconductor device 500 includes a clock generator 510 instead of the clock generator 110.

As illustratively shown in FIG. 5, the clock generator 510 includes logic elements NOR51, NOR52 and NAND51. Two input terminals of the logic element NOR51 are configured to receive the clock signals CKP1 and CKP2, respectively. Two input terminals of the logic element NAND51 are configured to receive the clock signal CLK and the enable signal CEB, respectively. Two input terminals of the logic element NOR52 are coupled to an output terminal of the logic element NOR51 and an output terminal of the logic element NAND51, respectively. The output terminal of the logic element NOR52 is configured to output the control signal CKGT at the node N11.

In some embodiments, the logic element NAND51 is implemented by a NAND logic gate. The logic elements NOR51 and NOR52 are implemented by NOR logic gates.

Figure 6A:
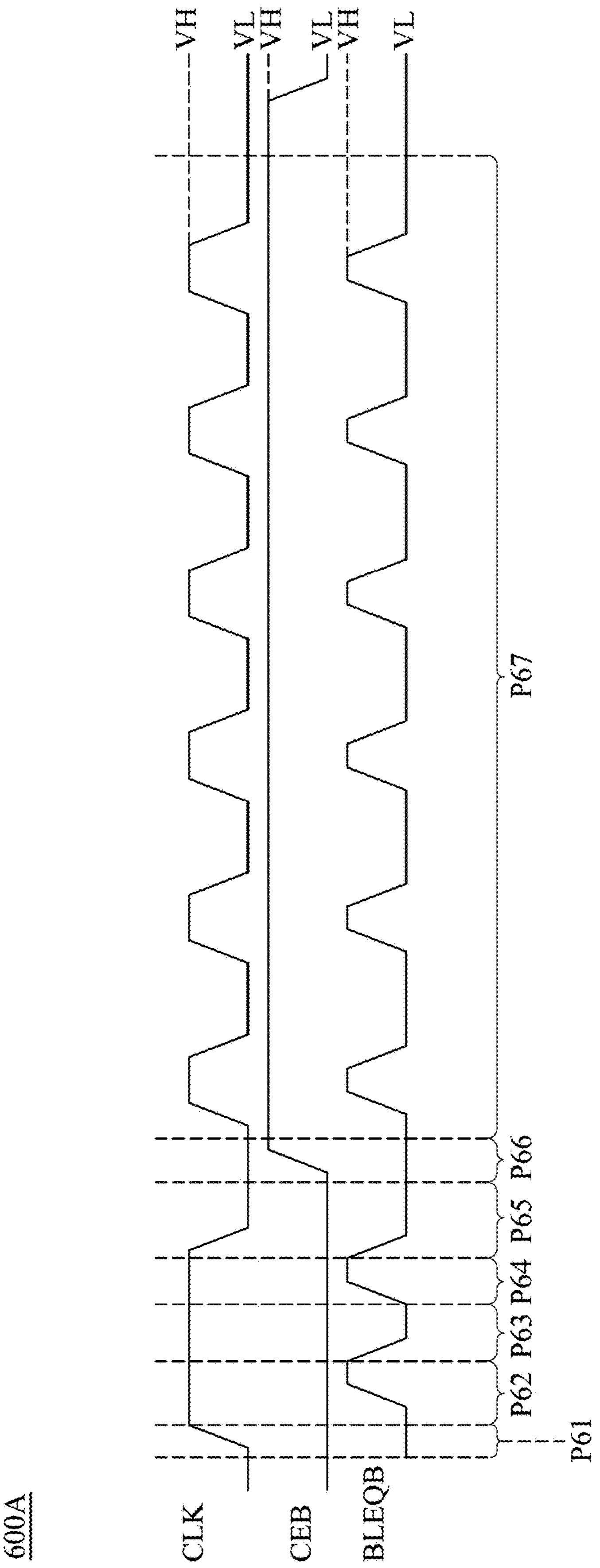
FIG. 6A is a timing diagram 600A corresponding to the semiconductor device 100 shown in FIG. 1, in accordance with some embodiments of the present disclosure.

FIG. 6A is a timing diagram 600A corresponding to the semiconductor device 100 shown in FIG. 1, in accordance with some embodiments of the present disclosure. As illustratively shown in FIG. 6A, the timing diagram 600A includes periods P61-P67 arranged in order. During periods P61-P67, the clock signal CLK, the enable signal CEB and the control signal BLEQB are configured to change between the voltage levels VH and VL.

Referring to FIG. 6A and FIG. 2A, operations of the timing diagram 600A is an alternative embodiment of operations of the timing diagram 200A. The periods P61-P66 correspond to the periods P22-P27, respectively. For brevity, the discussion will focus more on differences between FIG. 6A and FIG. 2A than on similarities.

During the period P61, the enable signal CEB has the voltage level VL, such that the control signal BLEQB also has the voltage level VL. Accordingly, the switches TP5 and TP6 are turned on, such that the bit line pre-charger 130 charges each of the bit lines BL and BLB. On the other hand, the clock signal CLK is changed from the voltage level VL to the voltage level VH.

During the period P62, the control signal BLEQB is changed from the voltage level VL to the voltage level VH to turn off the switches TP5 and TP6, such that the bit line pre-charger 130 stops to charge the bit lines BL and BLB. Accordingly, the memory cells perform the read operation with the bit lines BL and BLB.

During the period P63, the control signal BLEQB is changed from the voltage level VH to the voltage level VL to turn on the switches TP5 and TP6, such that the bit line pre-charger 130 provides the reference voltage signal VDD to each of the bit lines BL and BLB. Accordingly, each of the bit lines BL and BLB are pre-charged to the voltage level VH.

During the period P64, the control signal BLEQB is changed from the voltage level VL to the voltage level VH to turn off the switches TP5 and TP6, such that the bit line pre-charger 130 stops to provide the reference voltage signal VDD to the bit lines BL and BLB. Accordingly, the memory cells perform the write operation with the bit lines BL and BLB.

During the period P65, the control signal BLEQB is changed from the voltage level VH to the voltage level VL to turn on the switches TP5 and TP6, such that the bit line pre-charger 130 provides the reference voltage signal VDD to each of the bit lines BL and BLB. Accordingly, each of the bit lines BL and BLB are pre-charged to the voltage level VH. On the other hand, the clock signal CLK is changed from the voltage level VH to the voltage level VL.

During the period P66, the enable signal CEB is changed from the voltage level VL to the voltage level VH. During the period P67, the enable signal CEB is maintained at the voltage level VH. The clock signal CLK is toggled between the voltage levels VH and VL, such that the control signal BLEQB is also toggled between the voltage levels VH and VL.

Specifically, during the period P67, in response to the clock signal CLK changing from the voltage level VL to the voltage level VH, the control signal BLEQB is changed from the voltage level VL to the voltage level VH. In response to the clock signal CLK changing from the voltage level VH to the voltage level VL, the control signal BLEQB is changed from the voltage level VH to the voltage level VL. When the clock signal CLK has the voltage level VL, the control signal BLEQB has the voltage level VL. When the clock signal CLK has the voltage level VH, the control signal BLEQB has the voltage level VH. It is noted that the switches TP5-TP7 are turned off when the control signal BLEQB has the voltage level VH.

Correspondingly, the nodes N11-N16 are toggled between the voltage levels VH and VL. In some embodiments, the period P67 is referred to a standby period. During the standby period, the semiconductor device 500 is in a non-operation mode, and the chip corresponding to the semiconductor device 500 is deselected and disable.

Alternatively stated, the clock signal CLK is utilized in the non-operation mode to refresh the bit line pre-charge timing window generation critical path under BTI effect. During the period P67, the control signal BLEQB follows the clock signal CLK to be toggled when the chip is deselected, and the bit line pre-charge path is toggled when the chip is disable for BTI recovery.

In some approaches, falling edge devices of a bit line pre-charge timing window generation critical path receives a reference voltage signal having a high voltage level during a standby period. Accordingly, the bit line pre-charge timing window generation critical path is impacted by the BTI effect.

Compared to above approaches, in some embodiments of present disclosure, with the operations shown in FIG. 6A, the nodes N11-N16 of the bit line pre-charge timing window generation critical path are toggled the standby period P67. As a result, the BTI effect on the falling edge devices is reduced.

Figure 6B:
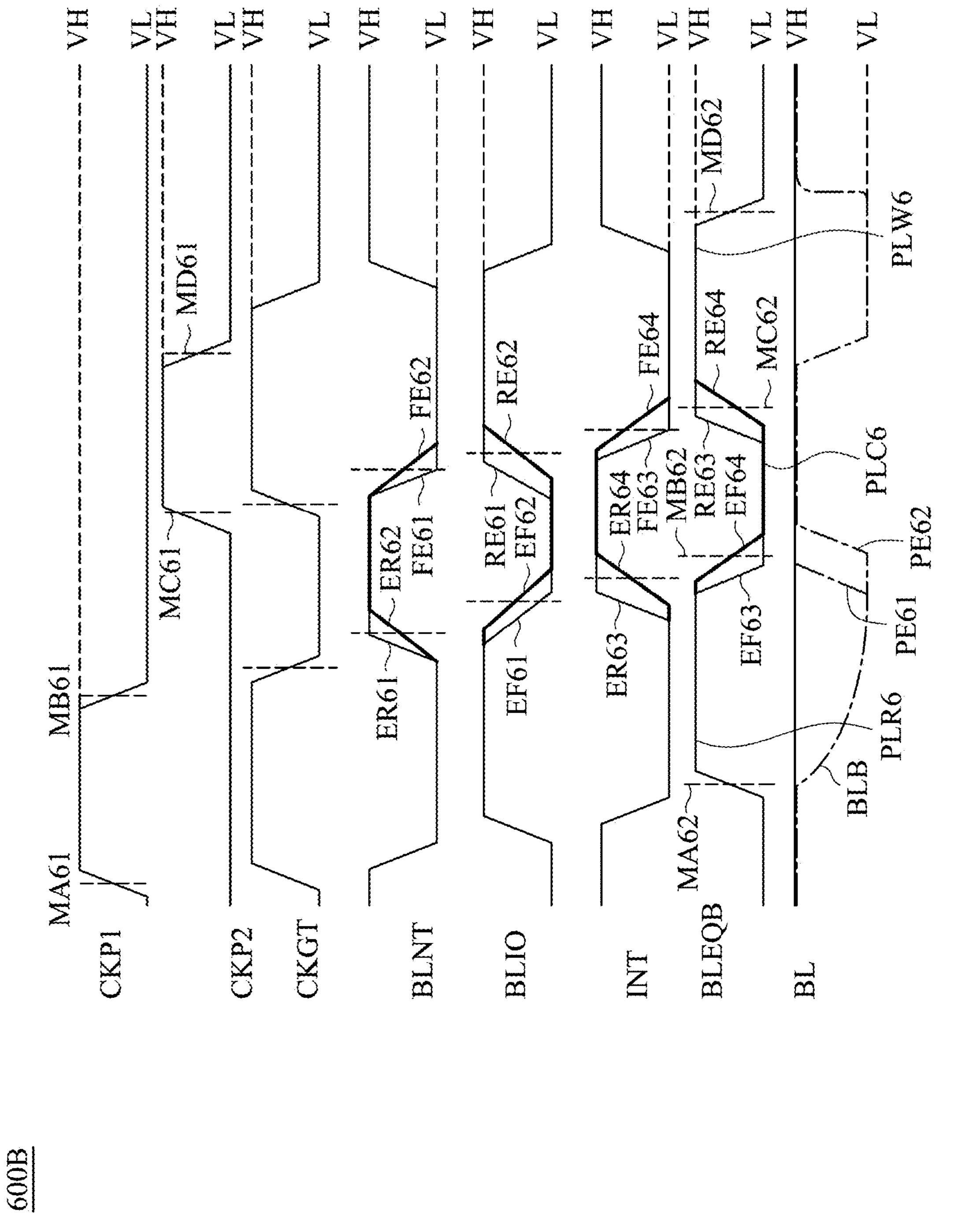
FIG. 6B is a timing diagram 600B corresponding to the semiconductor device 500 shown in FIG. 5, in accordance with some embodiments of the present disclosure.

FIG. 6B is a timing diagram 600B corresponding to the semiconductor device 500 shown in FIG. 5, in accordance with some embodiments of the present disclosure. As illustratively shown in FIG. 6B, the timing diagram 600B includes moments MA61, MA62, MB61, MB62, MC61, MC62, MD61 and MD62 arranged in order. The control signal BLEQB has pulses PLR6, PLC6 and PLW6.

At the moment MA61, the clock signal CKP1 is raised from the voltage level VL to the voltage level VH. Accordingly, at the moment MA62, the control signal BLEQB is raised from the voltage level VL to the voltage level VH to form a rising edge of the pulse PLR6. Between the moments MA61 and MA62, the control signal CKGT is raised from the voltage level VL to the voltage level VH, the control signal BLNT is fallen from the voltage level VH to the voltage level VL, the control signal BLIO is raised from the voltage level VL to the voltage level VH, and the control signal INT is fallen from the voltage level VH to the voltage level VL.

After the moment MA62, in response to the control signal BLEQB having the voltage level VH, the switches TP5 and TP6 are turned off to stop to charge the bit lines BL and BLB, such that the bit lines BL and BLB perform the read operation. In the embodiment shown in FIG. 6B, the bit lines BL and BLB carry the logic value 1 and the logic value 0, respectively. Accordingly, the bit line BL is maintained at the voltage level VH, and the voltage level of the bit line BLB is decreased.

At the moment MB61, the clock signal CKP1 is fallen from the voltage level VH to the voltage level VL. Accordingly, around the moment MB62, the control signal BLEQB is fallen from the voltage level VH to the voltage level VL to form a falling edge of the pulse PLR6. Between the moments MB61 and MB62, the control signal CKGT is fallen from the voltage level VH to the voltage level VL, the control signal BLNT is raised from the voltage level VL to the voltage level VH, the control signal BLIO is fallen from the voltage level VH to the voltage level VL, and the control signal INT is raised from the voltage level VL to the voltage level VH.

As illustratively shown in FIG. 6B, the timing diagram 600B includes falling edges EF61-EF64 and rising edges ER61-ER64. Referring to FIG. 5 and FIG. 6B, before the buffer circuit 120 is affected by aging effect, the control signals BLNT, BLIO, INT and BLEQB have the rising edge ER61, the falling edge EF61, the rising edge ER63 and the falling edge EF63, respectively. After the buffer circuit 120 is affected by the aging effect, the control signals BLNT, BLIO, INT and BLEQB have the rising edge ER62, the falling edge EF62, the rising edge ER64 and the falling edge EF64, respectively.

In response to the aging effect, an absolute value of a slope of the falling edge EF61 is larger than an absolute value of a slope of the falling edge EF62. An absolute value of a slope of the rising edge ER61 is larger than an absolute value of a slope of the rising edge ER62. An absolute value of a slope of the falling edge EF63 is larger than an absolute value of a slope of the falling edge EF64. An absolute value of a slope of the rising edge ER63 is larger than an absolute value of a slope of the rising edge ER64.

Referring to FIG. 5 and FIG. 6B, the falling edges EF61-EF64 and the rising edges ER61-ER64 correspond to the falling edge devices of the buffer circuit 120. Referring to FIG. 6A and FIG. 6B, in response to the toggling during the period P67, the aging effect of the falling edge devices is reduced to improve the pulse PLC6.

As illustratively shown in FIG. 6B, before the aging effect, in response to the control signal BLEQB having the falling edge EF63, the bit line BLB has a rising edge PE61. After the aging effect, in response to the control signal BLEQB having the falling edge EF64, the bit line BLB has a rising edge PE62.

After the moment MB62, in response to the control signal BLEQB having the voltage level VL, the switches TP5 and TP6 are turned on to charge each of the bit lines BL and BLB, such that each of the bit lines BL and BLB has the voltage level VH.

At the moment MC61, the clock signal CKP2 is raised from the voltage level VL to the voltage level VH. Accordingly, around the moment MC62, the control signal BLEQB is raised from the voltage level VL to the voltage level VH. Between the moments MC61 and MC62, the control signal CKGT is raised from the voltage level VL to the voltage level VH, the control signal BLNT is fallen from the voltage level VH to the voltage level VL, the control signal BLIO is raised from the voltage level VL to the voltage level VH, and the control signal INT is fallen from the voltage level VH to the voltage level VL.

As illustratively shown in FIG. 6B, the timing diagram 600B includes falling edges FE61-FE64 and rising edges RE61-RE64. Referring to FIG. 5 and FIG. 6B, before the buffer circuit 120 is affected by aging effect, the control signals BLNT, BLIO, INT and BLEQB have the falling edge FE61, the rising edge RE61, the falling edge FE63 and the rising edge RE63, respectively. After the buffer circuit 120 is affected by the aging effect, the control signals BLNT, BLIO, INT and BLEQB have the falling edge FE62, the rising edge RE62, the falling edge FE64 and the rising edge RE64, respectively.

In response to the aging effect, an absolute value of a slope of the falling edge FE61 is larger than an absolute value of a slope of the falling edge FE62. An absolute value of a slope of the rising edge RE61 is larger than an absolute value of a slope of the rising edge RE62. An absolute value of a slope of the falling edge FE63 is larger than an absolute value of a slope of the falling edge FE64. An absolute value of a slope of the rising edge RE63 is larger than an absolute value of a slope of the rising edge RE64.

After the moment MC62, in response to the control signal BLEQB having the voltage level VH, the switches TP5 and TP6 are turned off to stop to charge the bit lines BL and BLB, such that the bit lines BL and BLB perform the write operation. Accordingly, the bit line BL is maintained at the voltage level VH, and the voltage level of the bit line BLB is decreased.

At the moment MD61, the clock signal CKP2 is fallen from the voltage level VH to the voltage level VL. Accordingly, at the moment MD62, the control signal BLEQB is fallen from the voltage level VH to the voltage level VL to form a falling edge of the pulse PLW6. Between the moments MD61 and MD62, the control signal CKGT is fallen from the voltage level VH to the voltage level VL, the control signal BLNT is raised from the voltage level VL to the voltage level VH, the control signal BLIO is fallen from the voltage level VH to the voltage level VL, and the control signal INT is raised from the voltage level VL to the voltage level VH.

After the moment MD62, in response to the control signal BLEQB having the voltage level VL, the switches TP5 and TP6 are turned on to charge each of the bit lines BL and BLB, such that each of the bit lines BL and BLB has the voltage level VH.

Referring to FIG. 6B and FIG. 6A, the pulse PLR6 corresponds to the period P62 and the read operation. The pulse PLC6 corresponds to the period P63 and the pre-charge operation. The pulse PLW6 corresponds to the period P64 and the write operation. For example, the enable signal CEB is maintained at the voltage level VL between the moment MA62 and MD62, and the clock signal CLK is maintained at the voltage level VH between the moment MA62 and MD62.

Figure 7:
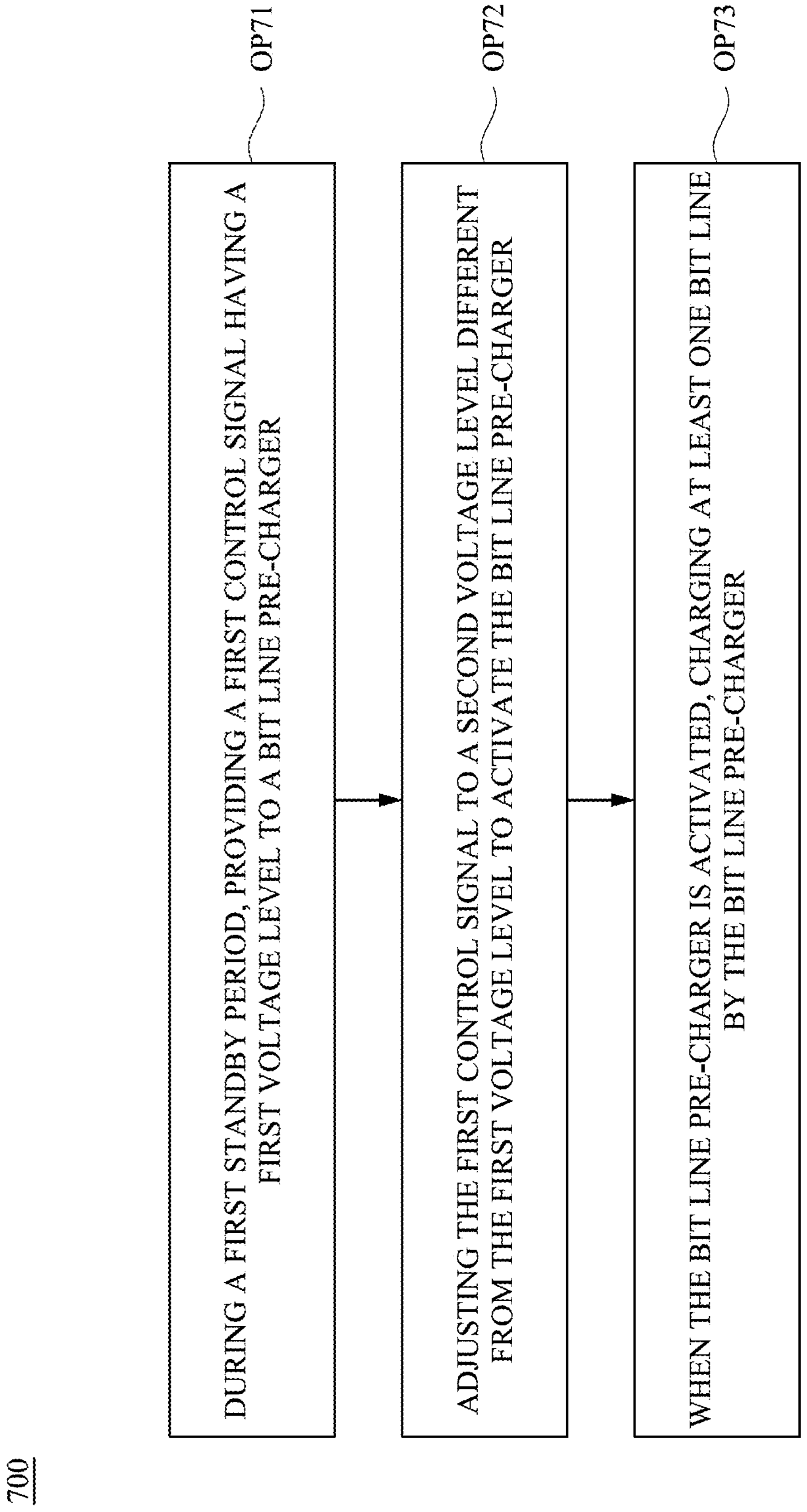
FIG. 7 is a flowchart diagram of a method corresponding to the semiconductor devices shown in FIG. 1, FIG. 3 and FIG. 5, in accordance with some embodiments of the present disclosure.

FIG. 7 is a flowchart diagram of a method 700 corresponding to the semiconductor devices 100, 300 and 500 shown in FIG. 1, FIG. 3 and FIG. 5, in accordance with some embodiments of the present disclosure. As illustratively shown in FIG. 7, the method 700 includes operations OP71-OP73.

During the operations OP71, during a first standby period, a first control signal having a first voltage level is provided to a bit line pre-charger. For example, during the period P21 shown in FIG. 2A, the control signal BLEQB having the voltage level VH is provided to the bit line pre-charger 130. For another example, during the period P41 shown in FIG. 4A, the control signal BLEQB having the floated level is provided to the bit line pre-charger 130. For a further example, during the period P67 shown in FIG. 6A, when the control signal BLEQB is toggled to the voltage level VH, the control signal BLEQB having the voltage level VH is provided to the bit line pre-charger 130.

During the operations OP72, the first control signal is adjusted to a second voltage level different from the first voltage level to activate the bit line pre-charger. For example, the control signal BLEQB is adjusted to the voltage level VL to activate the bit line pre-charger 130.

During the operations OP73, when the bit line pre-charger is activated, at least one bit line is charged by the bit line pre-charger. For example, when the bit line pre-charger 130 is activated, the bit lines BL and BLB are charged by the bit line pre-charger 130.

In some embodiments, the method 700 further includes: during a second standby period, maintaining the first control signal at the first voltage level; performing a read operation and a write operation with the at least one bit line between the first standby period and the second standby period; adjusting the first control signal from the first voltage level to the second voltage level between the first standby period and the read operation; and adjusting the first control signal from the second voltage level to the first voltage level between the write operation and the second standby period.

For example, during the standby period P28, the control signal BLEQB is maintained at the voltage level VH. The read operation of the period P23 and the write operation of the period P25 are performed with the bit lines BL and BLB between the standby periods P21 and P28. The control signal BLEQB is adjusted from the voltage level VH to the voltage level VL between the standby period P21 and the read operation of the period P23. The control signal BLEQB is adjusted from the voltage level VH to the voltage level VL between the write operation of the period P25 and the standby period P28.

In some embodiments, the method 700 further includes: generating the first control signal according to an enable signal. The enable signal is maintained at the first voltage level during the first standby period and the second standby period, and the enable signal is maintained at the second voltage level during the read operation and the write operation.

For example, the control signal BLEQB is generated according to the enable signal CEB. The enable signal CEB is maintained at the voltage level VH during the standby period P21 and the standby period P28, and the enable signal CEB is maintained at the voltage level VL during the read operation of the period P23 and the write operation of the period P25.

In some embodiments, the method 700 further includes: generating a second control signal at a first node; generating the first control signal at a second node according to the second control signal by a plurality of inverters; and during the first standby period, floating each of the first node and the second node.

For example, the control signal CKGT is generated at the node N11. The control signal BLEQB is generated at the node N16 according to the control signal CKGT by the inverters of the switches TP1-TP4 and TN1-TN4. During the period P41, each of the nodes N11 and N16 is floated.

In some embodiments, the method 700 further includes: providing a reference voltage signal to power terminals of the plurality of inverters. During the first standby period, the reference voltage signal has the second voltage level, and when the bit line pre-charger is activated, the reference voltage signal has the first voltage level.

For example, as illustratively shown in FIG. 3, the reference voltage signal VDBL is provided to power terminals of the inverters of the switches TP1-TP4 and TN1-TN4. During the standby period P41, the reference voltage signal VDBL has the voltage level VL, and when the bit line pre-charger 130 is activated (such as, during the periods P42, P44 and P46), the reference voltage signal VDBL has the first voltage level VH.

In some embodiments, the method 700 further includes: during the first standby period, toggling the first control signal between the first voltage level and the second voltage level. For example, during the standby period P67, the control signal BLEQB is toggled between the voltage level VH and the second voltage level VL.

In some embodiments, the method 700 further includes: generating the first control signal according to an enable signal and a clock signal; and during the first standby period, toggling the clock signal and maintaining the enable signal at the first voltage level.

For example, as illustratively shown in FIG. 5, the control signal BLEQB is generated according to the enable signal CEB and the clock signal CLK. During the standby period P67, the clock signal CLK is toggled, and the enable signal CEB is maintained at the voltage level VH.

In some embodiments, the method 700 further includes: receiving each of the clock signal and the enable signal by a logic element. For example, each of the clock signal CLK and the enable signal CEB is received by the logic element NAND51.

Figure 8:
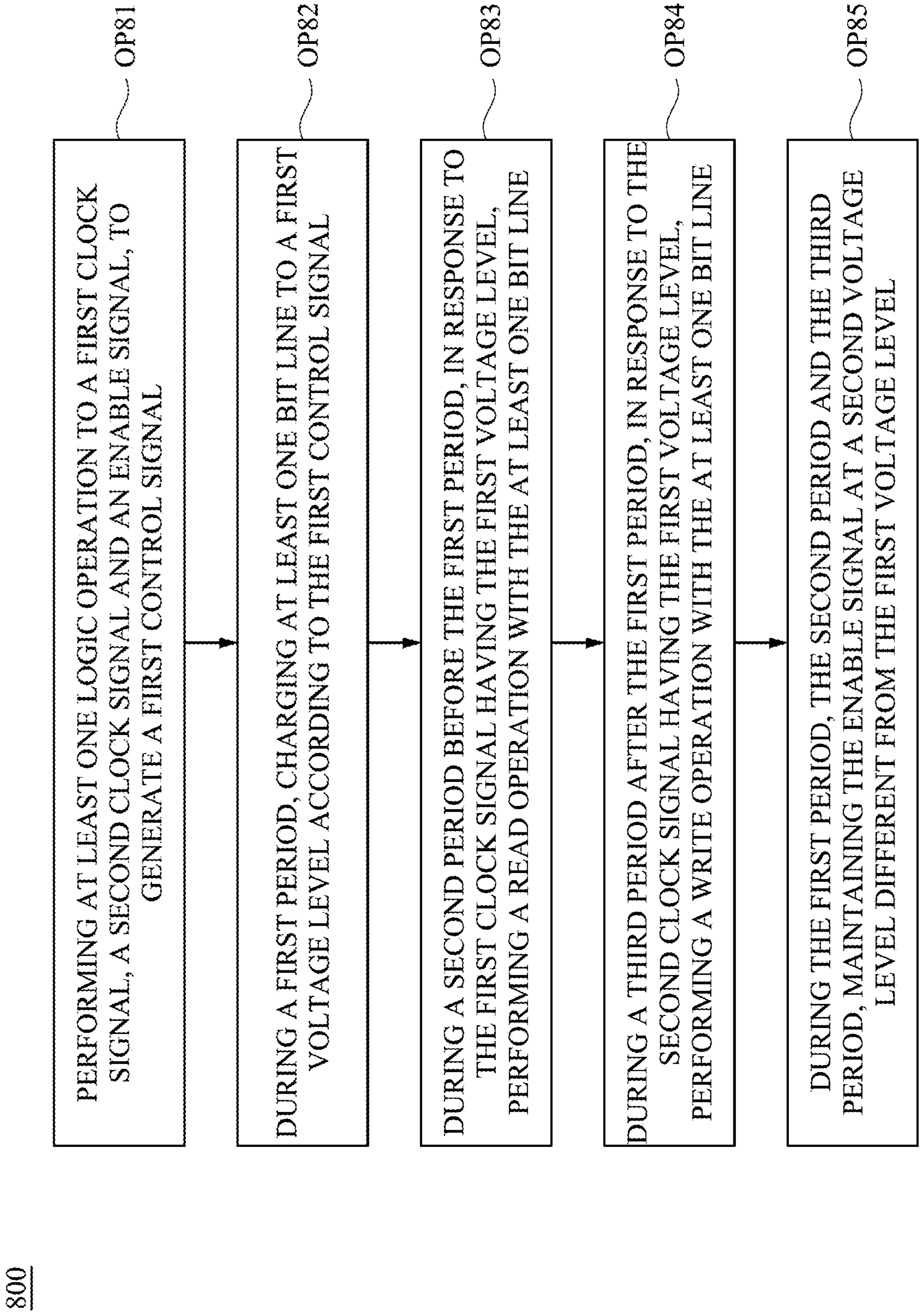
FIG. 8 is a flowchart diagram of a method corresponding to the semiconductor devices shown in FIG. 1, FIG. 3 and FIG. 5, in accordance with some embodiments of the present disclosure.

FIG. 8 is a flowchart diagram of a method 800 corresponding to the semiconductor devices 100, 300 and 500 shown in FIG. 1, FIG. 3 and FIG. 5, in accordance with some embodiments of the present disclosure. As illustratively shown in FIG. 8, the method 800 includes operations OP81-OP85.

During the operations OP81, at least one logic operation is performed to a first clock signal, a second clock signal and an enable signal, to generate a first control signal. For example, as illustratively shown in FIG. 1, a NOR logic operation is perform to the clock signals CKP1, CKP2 and the enable signal CEB, to generate the control signal BLEQB. For another example, as illustratively shown in FIG. 5, a NOR logic operation is perform to the clock signals CKP1 and CKP2, and a NAND logic operation is perform to the clock signal CLK and the enable signal CEB, to generate the control signal BLEQB.

During the operations OP82, during a first period, at least one bit line is charged to a first voltage level according to the first control signal. For example, as illustratively shown in FIG. 2A and FIG. 6A, during the period P24 or P63, the bit lines BL and BLB are charged to the voltage level VH according to the control signal BLEQB.

During the operations OP83, during a second period before the first period, in response to the first clock signal having the first voltage level, a read operation is performed with the at least one bit line. For example, during the period P23 or P62, in response to the clock signal CKP1 having the voltage level VH, the read operation is performed with the bit lines BL and BLB.

During the operations OP84, during a third period after the first period, in response to the second clock signal having the first voltage level, a write operation is performed with the at least one bit line. For example, during the period P25 or P64, in response to the clock signal CKP2 having the voltage level VH, the write operation is performed with the bit lines BL and BLB.

During the operations OP85, during the first period, the second period and the third period, the enable signal is maintained at a second voltage level different from the first voltage level. For example, during the periods P23-P25 or P62-P64, the enable signal CEB is maintained at the voltage level VL.

In some embodiments, the method 800 further includes: during a first standby period and a second standby period, maintaining each of the enable signal and the first control signal at the first voltage level. For example, during the standby periods P21 and P28, each of the enable signal CEB and the control signal BLEQB is maintained at the voltage level VH.

In some embodiments, the method 800 further includes: during a standby period after the third period, maintaining the enable signal at the first voltage level, and toggling the first control signal between the first voltage level and the second voltage level. For example, during the standby period P67, the enable signal CEB is maintained at the voltage level VH, and the control signal BLEQB is toggled between the voltage levels VH and VL.

Also disclosed is a semiconductor device. The semiconductor device includes a bit line pre-charger and a buffer circuit. The bit line pre-charger is configured to charge at least one bit line when a first control signal has a first voltage level. The buffer circuit is configured to generate the first control signal. During a first standby period, the buffer circuit adjusts the first control signal to a second voltage level different from the first voltage level.

Also disclosed is a method. The method includes: during a first standby period, providing a first control signal having a first voltage level to a bit line pre-charger; adjusting the first control signal to a second voltage level different from the first voltage level to activate the bit line pre-charger; and when the bit line pre-charger is activated, charging at least one bit line by the bit line pre-charger.

Also disclosed is a method. The method includes: performing at least one logic operation to a first clock signal, a second clock signal and an enable signal, to generate a first control signal; during a first period, charging at least one bit line to a first voltage level according to the first control signal; during a second period before the first period, in response to the first clock signal having the first voltage level, performing a read operation with the at least one bit line; during a third period after the first period, in response to the second clock signal having the first voltage level, performing a write operation with the at least one bit line; and during the first period, the second period and the third period, maintaining the enable signal at a second voltage level different from the first voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

during a first standby period, providing a first control signal having a first voltage level to a bit line pre-charger;

adjusting the first control signal to a second voltage level different from the first voltage level to activate the bit line pre-charger;

when the bit line pre-charger is activated, charging at least one bit line by the bit line pre-charger; and generating the first control signal according to an enable signal and a first clock signal, generating the first control signal comprises:

receiving each of the first clock signal and the enable signal by a first logic element;

outputting a second control signal by a second logic element; and generating the first control signal based on the second control signal, wherein a first input terminal of the second logic element is coupled to an output terminal of the first logic element.

2. The method of claim 1, further comprising:
during the first standby period, toggling the first control signal between the first voltage level and the second voltage level.

3. The method of claim 2, further comprising:
during the first standby period, toggling the first clock signal and maintaining the enable signal at the first voltage level.

4. The method of claim 3, wherein generating the first control signal comprises:
receiving each of the first clock signal and the enable signal by a NAND logic gate.

5. The method of claim 1, wherein the second logic element is a NOR logic gate.

6. The method of claim 1, further comprising:
receiving a second clock signal and a third clock signal by a third logic element,
wherein a second input terminal of the second logic element is coupled to an output terminal of the third logic element.

7. The method of claim 6, wherein the third logic element is a NOR logic gate.

8. The method of claim 6, wherein the second clock signal and the third clock signal are different from each other.

9. The method of claim 8, wherein the second clock signal is changed between the first voltage level and the second voltage level when the third clock signal is maintained at the second voltage level.

10. The method of claim 9, wherein the third clock signal is changed between the first voltage level and the second voltage level when the second clock signal is maintained at the second voltage level.

11. A method, comprising:
providing a first control signal having a first voltage level to a bit line pre-charger;
during a first standby period, toggling the first control signal;
adjusting the first control signal to a second voltage level different from the first voltage level to activate the bit line pre-charger;
when the bit line pre-charger is activated, charging at least one bit line by the bit line pre-charger; and
generating the first control signal according to an enable signal and a first clock signal,
wherein generating the first control signal comprises:
receiving each of the first clock signal and the enable signal by a first logic element;
outputting a second control signal by a second logic element; and
generating the first control signal based on the second control signal,
wherein a first input terminal of the second logic element is coupled to an output terminal of the first logic element.

12. The method of claim 11, wherein toggling the first control signal comprises:
toggling the first control signal between the first voltage level and the second voltage level.

13. The method of claim 12, further comprising:
during the first standby period, toggling the first clock signal and maintaining the enable signal at the first voltage level.

14. The method of claim 13, wherein the first logic element is a NAND logic gate.

15. The method of claim 13, wherein the second logic element is a NOR logic gate.

16. The method of claim 13, further comprising:
receiving a second clock signal and a third clock signal by a third logic element,
wherein a second input terminal of the second logic element is coupled to an output terminal of the third logic element, and
the first clock signal, the second clock signal and the third clock signal are different from each other.

17. The method of claim 16, wherein the second logic element is a NOR logic gate.

18. The method of claim 11, further comprising:
receiving a second clock signal and a third clock signal by a third logic element,
wherein a second input terminal of the second logic element is coupled to an output terminal of the third logic element.

19. A method, comprising:
generating a first control signal according to an enable signal and a clock signal;
receiving each of the clock signal and the enable signal by a first logic element;
during a first standby period, providing the first control signal having a first voltage level to a bit line pre-charger;
adjusting the first control signal to a second voltage level different from the first voltage level to activate the bit line pre-charger; and
when the bit line pre-charger is activated, charging at least one bit line by the bit line pre-charger,
wherein generating the first control signal further comprises:
outputting a second control signal by a second logic element; and
generating the first control signal based on the second control signal,
wherein a first input terminal of the second logic element is coupled to an output terminal of the first logic element.

20. The method of claim 19, further comprising:
during the first standby period, toggling the first control signal between the first voltage level and the second voltage level; and
during the first standby period, toggling the clock signal and maintaining the enable signal at the first voltage level.

* * * * *